United States Patent
Yang et al.

(10) Patent No.: US 6,420,086 B1
(45) Date of Patent: Jul. 16, 2002

(54) METHODS OF FORMING PATTERNED CONSTRUCTIONS, METHODS OF PATTERNING SEMICONDUCTIVE SUBSTRATES, AND METHODS OF FORMING FIELD EMISSION DISPLAYS

(75) Inventors: Jianping P. Yang; David H. Wells, both of Boise; Eric J. Knappenberger, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/765,211

(22) Filed: Jan. 16, 2001

Related U.S. Application Data

(63) Continuation of application No. 09/251,905, filed on Feb. 19, 1999, now Pat. No. 6,207,578.

(51) Int. Cl.$^7$ .................................. G03C 1/76
(52) U.S. Cl. ................... 430/270.1; 430/273.1; 430/299
(58) Field of Search ................... 438/706, 707, 438/709; 430/259, 326, 273.1, 283, 151, 270.1

(56) References Cited

U.S. PATENT DOCUMENTS

| | | | |
|---|---|---|---|
| 4,273,858 A | 6/1981 | Nagasawa et al. | ........... 430/296 |
| 4,407,695 A | 10/1983 | Deckman et al. | .............. 210/42 |

(List continued on next page.)

OTHER PUBLICATIONS

Deckman, H. et al., "Applications of Surface Textures Produced with Natural Lithography", J. Vac. Sci. Technol. (prior to Jan. 16, 2001), (accepted Sep. 2, 1983), pp. 1109–1112.

(List continued on next page.)

*Primary Examiner*—Benjamin L. Utech
*Assistant Examiner*—Binh X. Tran
(74) *Attorney, Agent, or Firm*—Wells St. John P.S.

(57) ABSTRACT

In one aspect, the invention includes a method of patterning a substrate. A film is formed over a substrate and comprises a plurality of individual molecules. The individual molecules comprise two ends with one of the two ends being directed toward the substrate and the other of the two ends being directed away from the substrate. Particle-adhering groups are bound to said other of the two ends of at least some of the individual molecules and a plurality of particles are adhered to the particle-adhering groups to form a mask over the substrate. The substrate is etched while the mask protects portions of the substrate. In another aspect, the invention encompasses a method of forming a field emission display. A material having a surface of exposed nitrogen-containing groups is formed over the substrate. At least one portion of the material is exposed to radiation while at least one other portion of the material is not exposed. The exposing renders one of the exposed or unexposed portions better at bonding the masking particles than the other of the exposed and unexposed portions. After the exposing, the material is bonded with masking particles. The adhered masking particles define a mask over the semiconductive substrate. The substrate is etched while the patterned mask protects portions of the substrate. A plurality of emitters are formed from the substrate. A display screen is provided to be spaced from the emitters.

8 Claims, 7 Drawing Sheets

U.S. PATENT DOCUMENTS

| | | | |
|---|---|---|---|
| 4,539,061 A | | 9/1985 | Sagiv .................. 156/278 |
| 4,945,028 A | * | 7/1990 | Ogawa ................ 430/296 |
| 5,024,873 A | | 6/1991 | Burack et al. .......... 428/220 |
| 5,071,733 A | | 12/1991 | Uekita et al. .......... 430/326 |
| 5,079,600 A | | 1/1992 | Schnur et al. .......... 257/750 |
| 5,151,061 A | | 9/1992 | Sandhu ................ 445/24 |
| 5,186,670 A | | 2/1993 | Doan et al. ............ 445/24 |
| 5,210,472 A | | 5/1993 | Casper et al. .......... 315/349 |
| 5,220,725 A | | 6/1993 | Chan et al. ............ 29/874 |
| 5,245,248 A | | 9/1993 | Chan et al. ............ 313/309 |
| 5,256,749 A | | 10/1993 | Hickel et al. .......... 526/279 |
| 5,258,262 A | | 11/1993 | Erdelen et al. ......... 430/273 |
| 5,272,036 A | | 12/1993 | Tani et al. ............ 430/191 |
| 5,304,583 A | | 4/1994 | Ogawa ................ 522/148 |
| 5,391,259 A | | 2/1995 | Cathey et al. .......... 438/20 |
| 5,399,238 A | | 3/1995 | Kumar ................ 427/534 |
| 5,437,894 A | * | 8/1995 | Ogawa et al. .......... 427/535 |
| 5,510,156 A | | 4/1996 | Zhao .................. 427/534 |
| 5,660,570 A | | 8/1997 | Chan et al. ............ 439/886 |
| 5,676,853 A | | 10/1997 | Alwan ................ 216/11 |
| 5,681,442 A | | 10/1997 | Ogawa et al. .......... 205/122 |

OTHER PUBLICATIONS

Kim, K. et al., "Generations of Charged Liquid Cluster Beam of Liquid–Mix Precursors and Application to Nano-structured Materials", Nanostructural Materials, vol. 4, No. 5, 1994 (Elsevier Sciences Ltd. 1994) pp. 597–602.

Robinson, D. et al., "Initiation of Aggregation in Colloids Particle Monolayer", Langmiur, vol. 9, No. 5, 1993, pp. 1436–1438.

Deckman, H. et al., "Microfabrication of Molecular Scale Microstructures", Appl. Phys. Lett., vol. 50, No. 9, Mar. 2, 1987, pp. 504–506.

Haginoya, C. et al., "Nanostructure Array Fabrication with a Size–controllable Natural Lithography", Appl. Phys. Lett. 71(20), Nov. 17, 1997, pp. 2934–2936.

Micheletto, R. et al., "A Simple Method for the Production of a Two–Dimensional, Ordered Array of Small Latex Particles", Langmuir, vol. 11, No. 9 (1995), pp. 3333–3336.

Horvolgyi, Z. et al., "Spreading of Hydrophobic Silica Beads at Water–air Interface", Colloids and Surfaces A: Physlochemical and Engineering Aspects, 71 (1993), pp. 327–335.

* cited by examiner

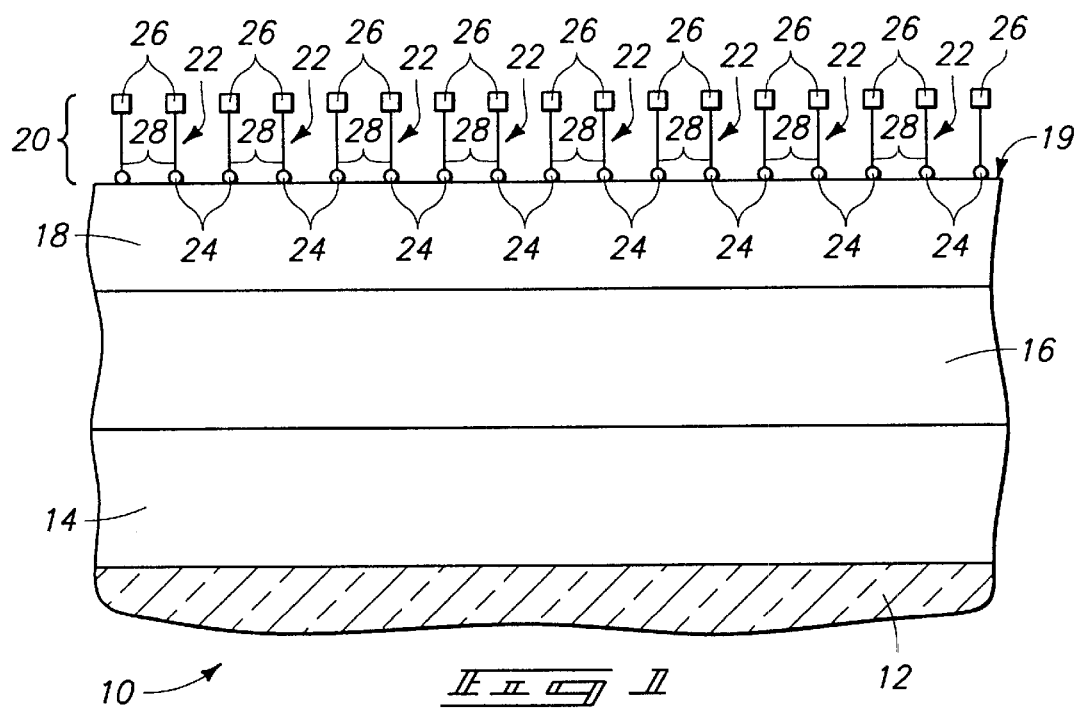
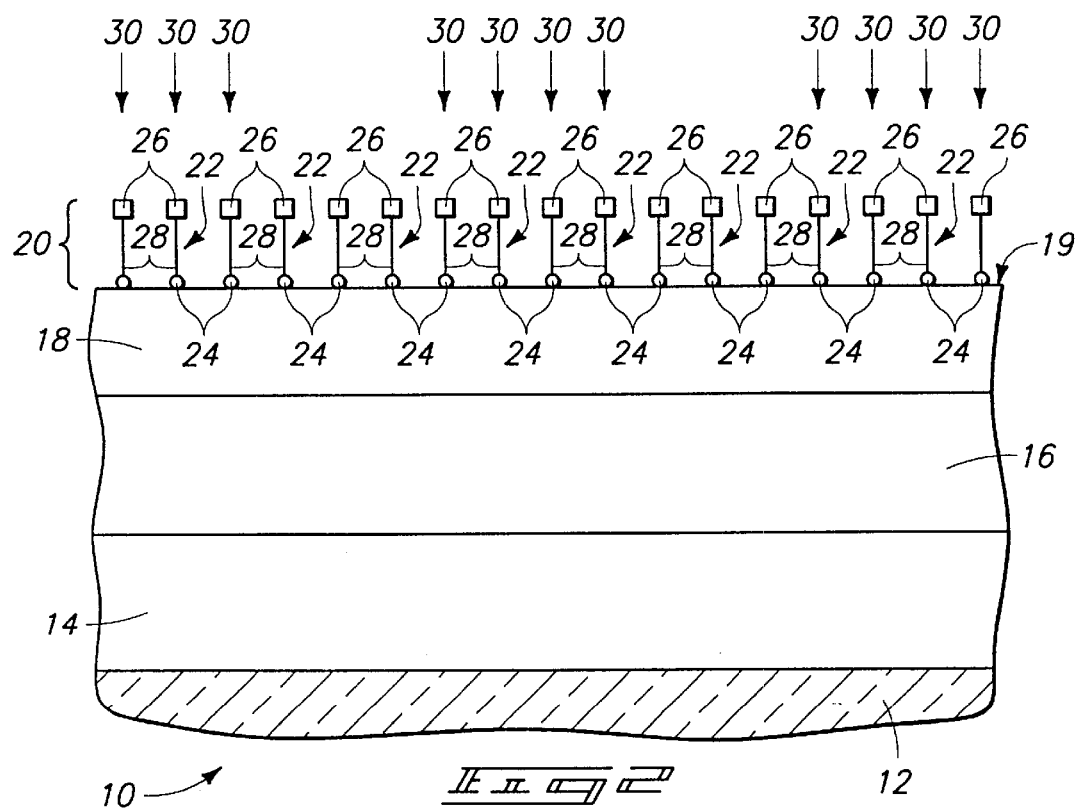

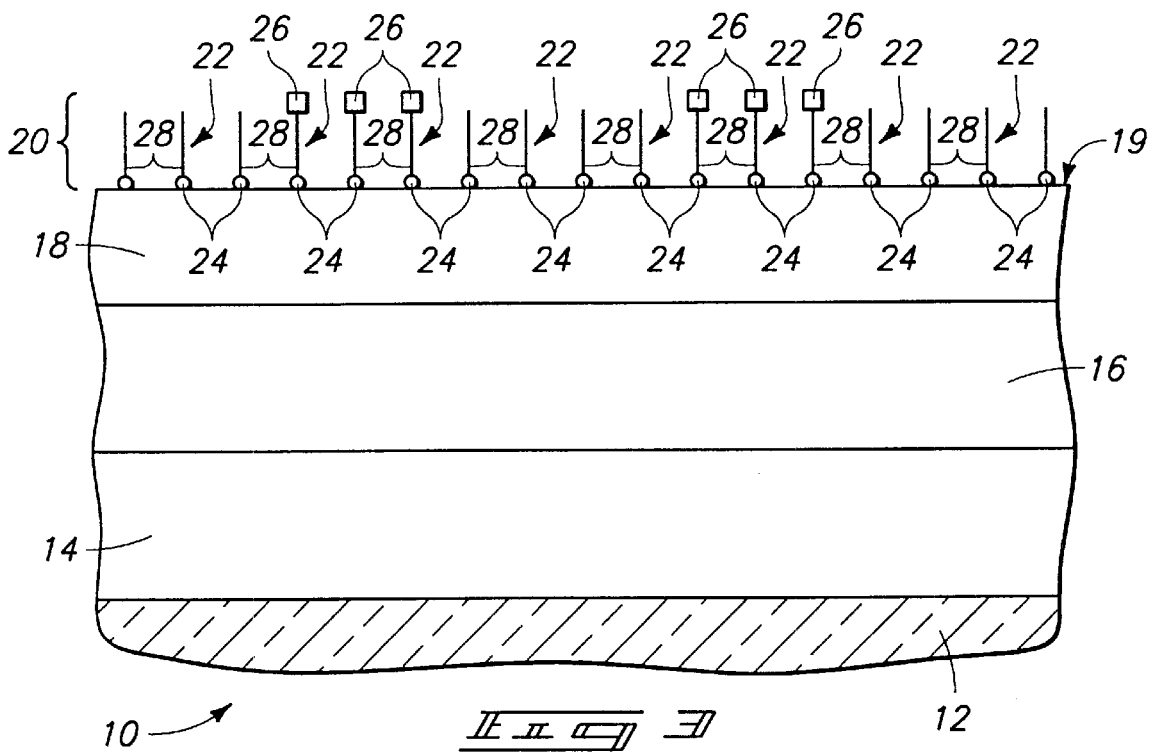
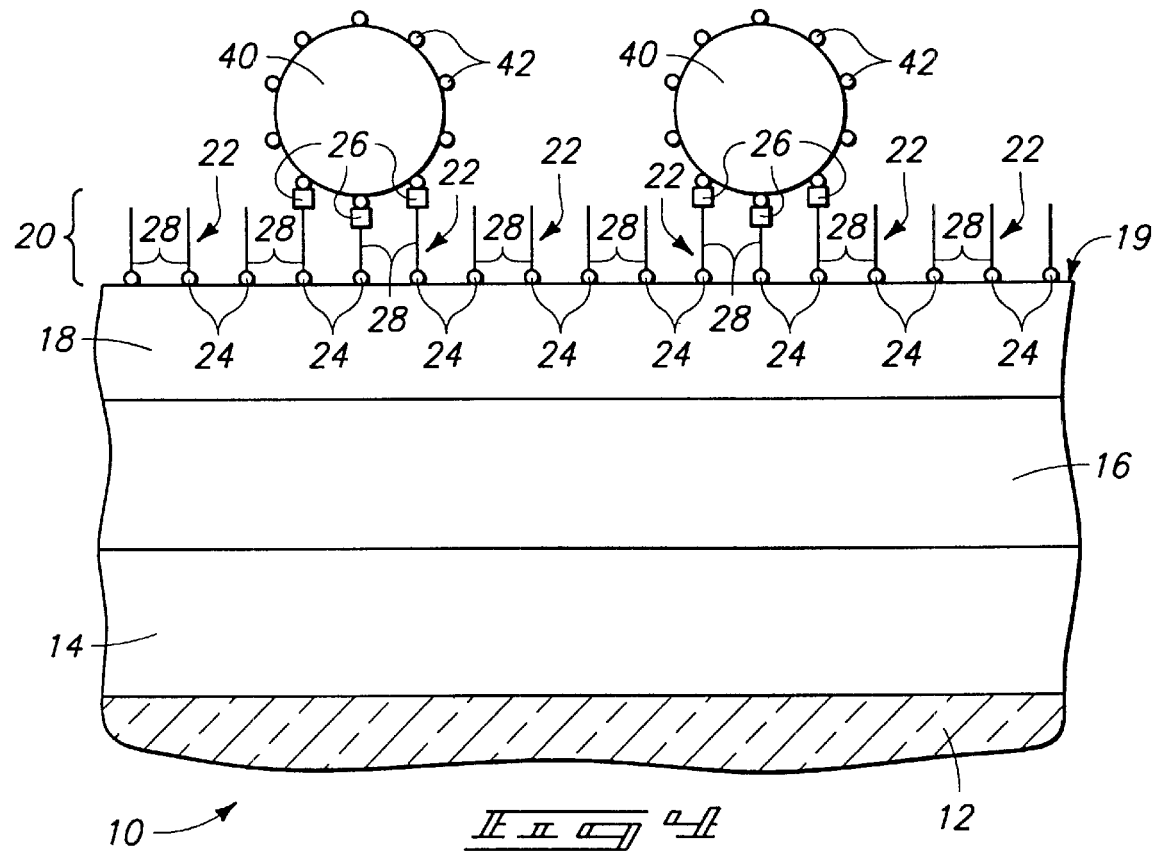

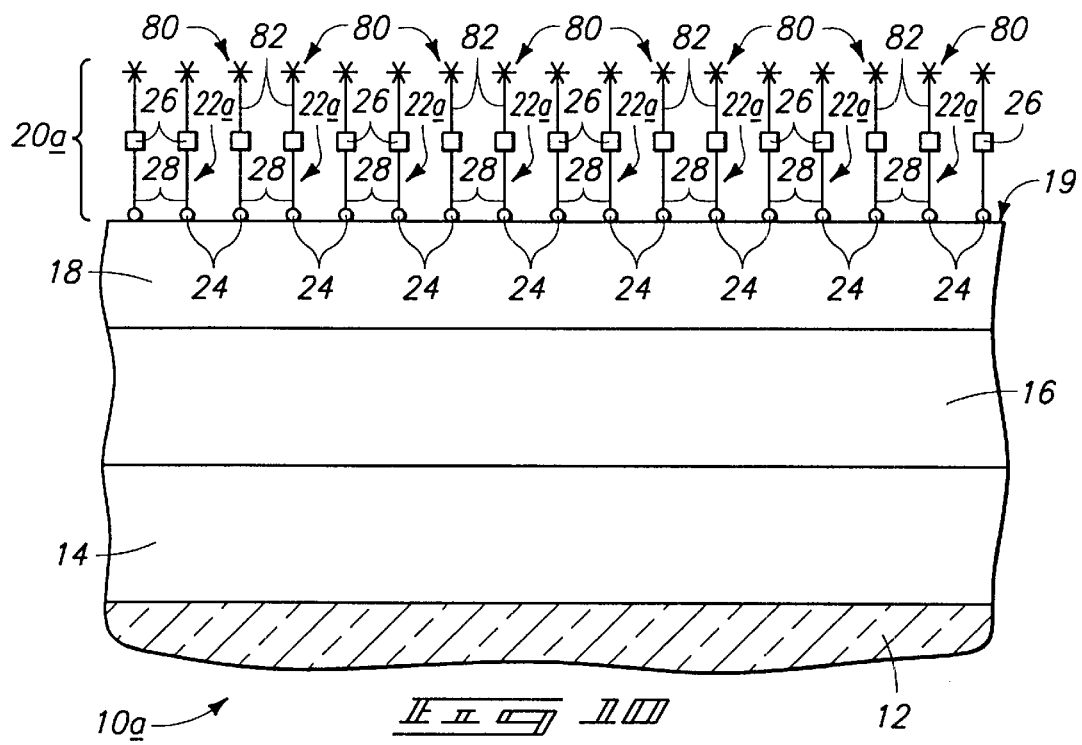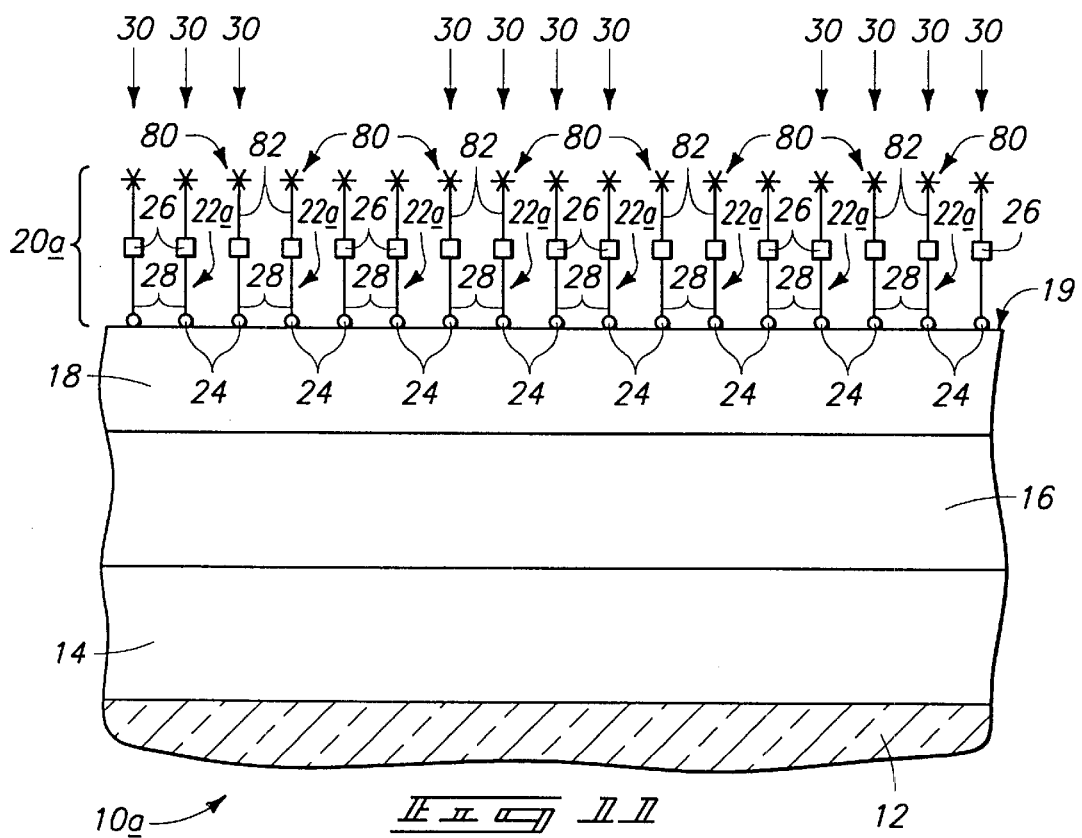

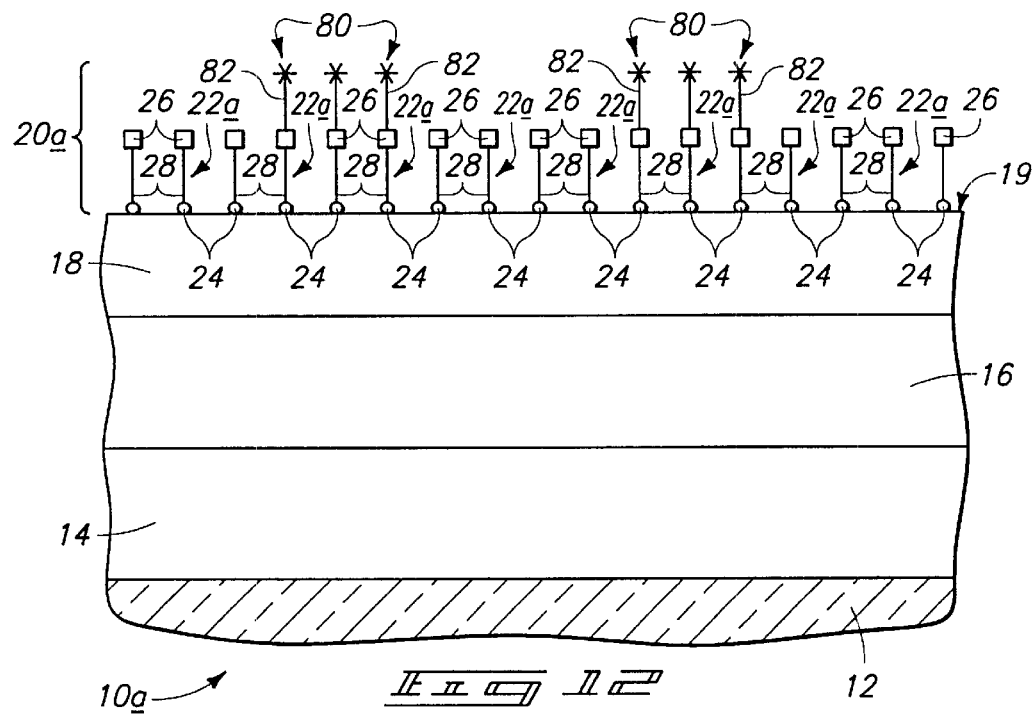
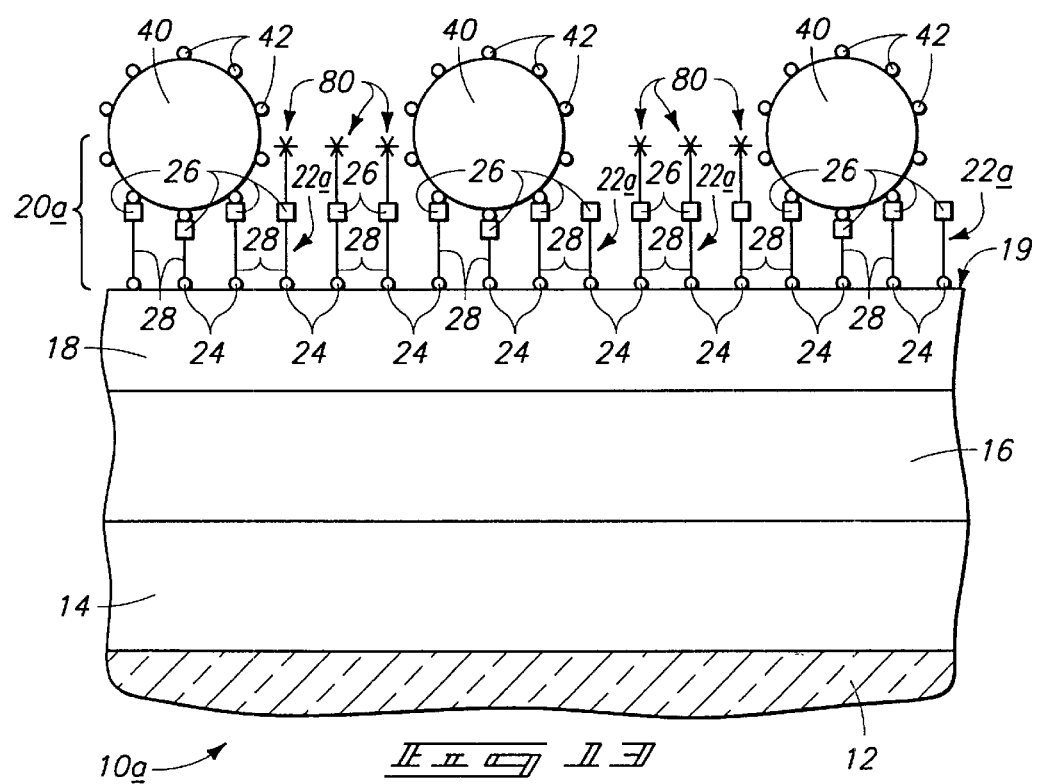

METHODS OF FORMING PATTERNED CONSTRUCTIONS, METHODS OF PATTERNING SEMICONDUCTIVE SUBSTRATES, AND METHODS OF FORMING FIELD EMISSION DISPLAYS

CROSS REFERENCE TO RELATED APPLICATION

This is a Continuation of U.S. patent application Ser. No. 09/251,905, now U.S. Pat. No 6,207,578 filed Feb. 19, 1999, and titled "Methods of Forming Patterned Constructions, Methods of Patterning Semiconductive Substrates, and Methods of Forming Field Emission Displays".

PATENT RIGHTS STATEMENT

This invention was made with Government support under Contract No. DABT63-97-C-0001 awarded by Advanced Research Projects Agency (ARPA). The Government has certain rights in this invention.

TECHNICAL FIELD

The invention pertains to methods of forming patterned constructions, such as methods of patterning semiconductive substrates. In a particular aspect, the invention pertains to methods of forming field emission displays.

BACKGROUND OF THE INVENTION

Modern semiconductor fabrication processes frequently involve patterning of materials. One common method of patterning is to form a layer of photosensitive material (e.g., photoresist) over a substrate and expose the material to a source of radiation. A mask is provided between the radiation and the photosensitive material, with the mask comprising opaque and transparent regions. The mask patterns the radiation passing through it, and the patterned radiation impacts the photosensitive material to create a pattern of exposed and unexposed regions. The exposed regions are rendered either more or less soluble in a solvent than the unexposed regions. After the exposure to the patterned beam of radiation, the solvent is utilized to selectively remove either the exposed or unexposed portions of the photosensitive layer and to thereby transfer a pattern from the mask onto the photosensitive layer. If the exposed portions are removed a positive image of the mask is formed in the photosensitive layer, and if the unexposed portions are removed a negative image of the mask is formed in the photosensitive layer.

The above-described processing is frequently referred to as "photolithographic processing". It is utilized for forming numerous patterned constructions for semiconductor devices. A difficulty with the method is that a resolution of the method can be limited by properties of the photosensitive material and optics of the pattern transfer tools. Accordingly, it would be desirable to develop improved methods of photolithographic processing, such as, for example, developing improved photosensitive materials.

In another aspect of the prior art, field emitters are used in display devices, such as, for example, flat panel displays. Emission current and brightness of a field emission display is a function of a number of factors, including emitter tip sharpness. Specifically, sharper emitter tips can produce higher resolution displays than less sharp emitter tips. Accordingly, numerous methods have been proposed for fabrication of very sharp emitter tips (i.e., emitter tips having tip radii of 100 nanometers or less). Fabrication of very sharp tips has, however, proved difficult. It has proved particularly difficult to build large areas of sharp emitter tips using the above-described photolithographic methods while maintaining resolution and stringent dimensional control over large area substrates used for display manufacture. A technology that has been proposed for enabling formation of emitter tips is a particle dispersment technology (such as the process of U.S. Pat. No. 5,676,853 to Alwan) wherein small particles are layered over a substrate to form a mask for formation of emitter tips. Thus far, the dispersment technologies have proved difficult to utilize in that it is difficult to stringently control the location of emitter tips formed from the somewhat random distribution of particulates over a substrate surface.

In light of the above-discussed difficulties, it would be desirable to develop alternative methods for forming emitter tips.

SUMMARY OF THE INVENTION

In one aspect, the invention includes a method of patterning a substrate. A film is formed over a substrate and comprises a plurality of individual molecules. The individual molecules comprise two ends, with one of the two ends being directed toward the substrate and the other of the two ends being directed away from the substrate. Particle-adhering groups are bound to said other of the two ends of at least some of the individual molecules, and a plurality of particles are adhered to the particle-adhering groups. The adhered particles are a mask over the substrate. The substrate is etched while the mask protects portions of the substrate.

In another aspect, the invention encompasses a method of forming a field emission display. A material is formed over a substrate. The material has a surface with exposed nitrogen-containing groups. At least one portion of the material is exposed to radiation while leaving at least one other portion of the material unexposed. The exposing renders one of the exposed or unexposed portions better at bonding the masking particles than the other of the exposed and unexposed portions. After the exposing, the material is bonded with masking particles. The bonding comprises reacting exposed moieties of the masking particles with the nitrogen-containing groups. The adhered masking particles define a mask over the semiconductive substrate. The substrate is etched while the mask protects portions of the substrate. A plurality of emitters are formed from the substrate. A display screen is provided to be spaced from the emitters.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductive material construction at a preliminary step of a processing method encompassed by the present invention.

FIG. 2 is a view of the FIG. 1 construction shown at a step subsequent to that of FIG. 1.

FIG. 3 is a view of the FIG. 1 construction shown at a step subsequent to that of FIG. 2.

FIG. 4 is a view of the FIG. 1 construction shown at a step subsequent to that of FIG. 3.

FIG. 10 is a diagrammatic, cross-sectional view of a semiconductive material construction at a preliminary step of a second embodiment processing method encompassed by the present invention.

FIG. 11 is a view of the FIG. 10 construction shown at a step subsequent to that of FIG. 10.

FIG. 12 is a view of the FIG. 10 construction shown at a step subsequent to that of FIG. 11.

FIG. 13 is a view of the FIG. 10 construction shown at a step subsequent to that of FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 5:
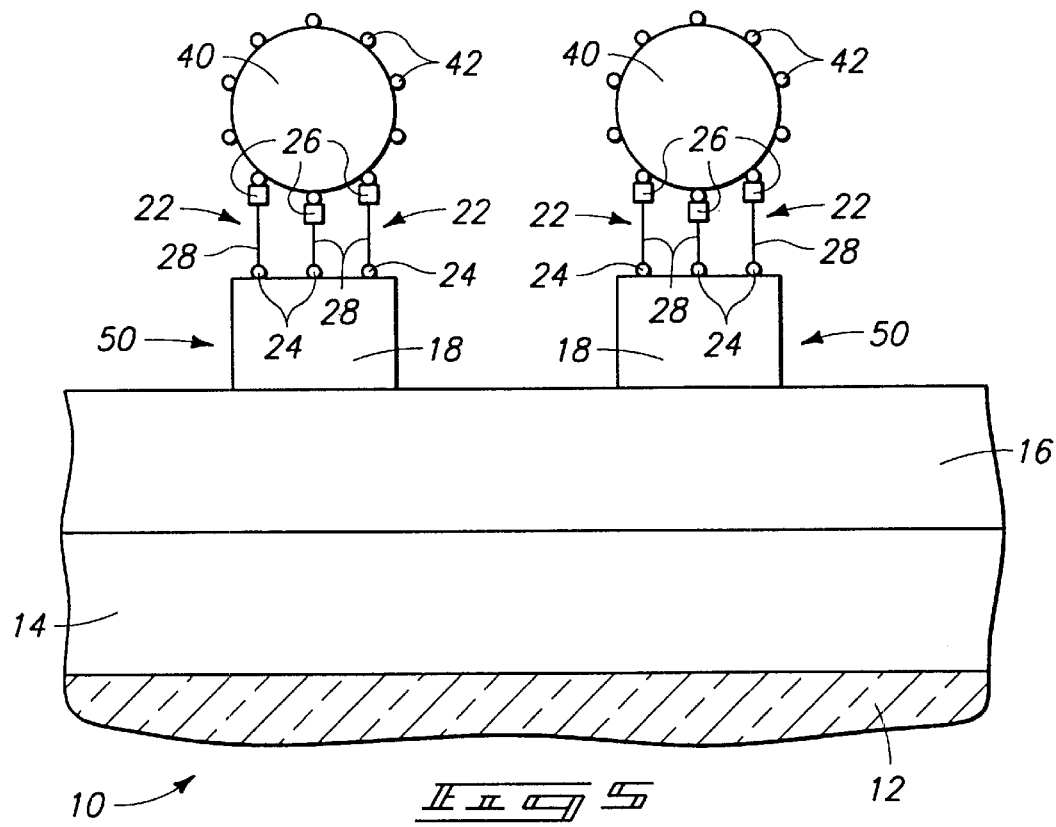
FIG. 5 is a view of the FIG. 1 construction shown at a step subsequent to that of FIG. 4.
Figure 6:
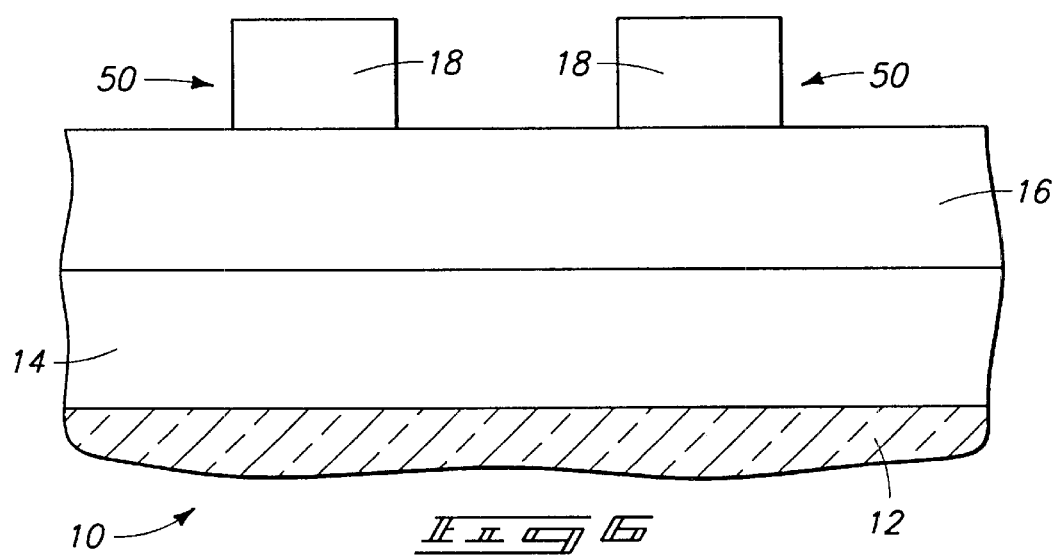
FIG. 6 is a view of the FIG. 1 construction shown at a step subsequent to that of FIG. 5.
Figure 7:
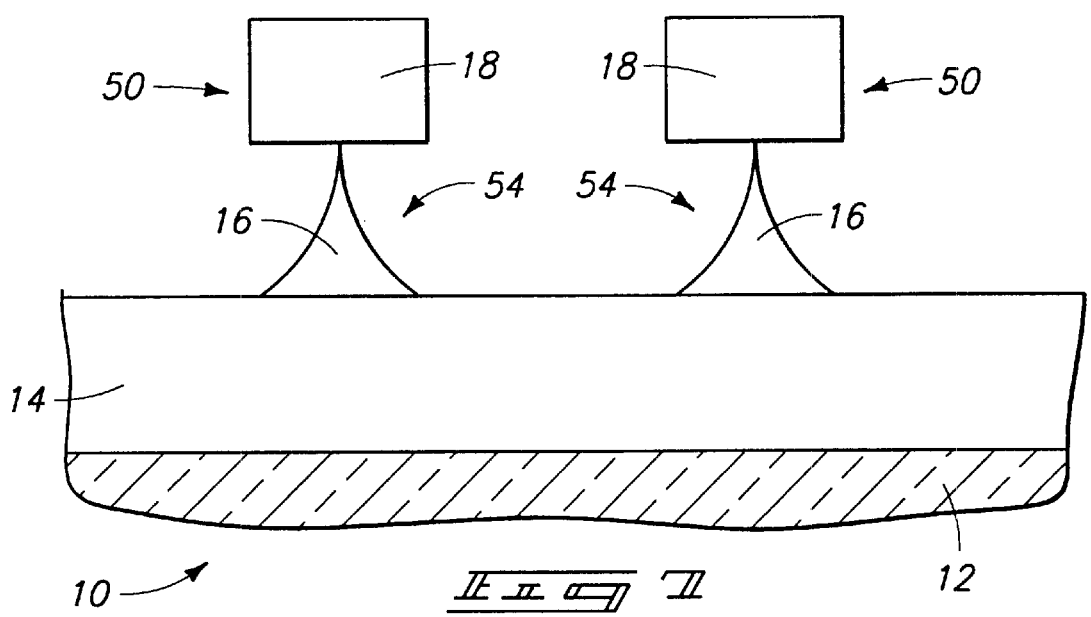
FIG. 7 is a view of the FIG. 1 construction shown at a step subsequent to that of FIG. 6.
Figure 8:
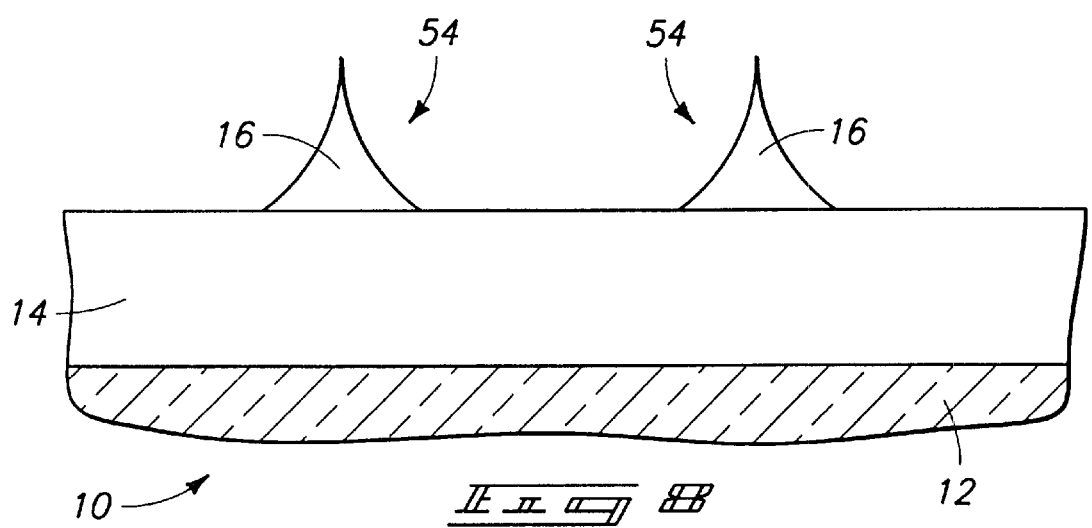
FIG. 8 is a view of the FIG. 1 construction shown at a step subsequent to that of FIG. 7.

The invention encompasses methods of patterning materials. An exemplary application of a method of the present invention is for utilization in patterning during semiconductive material fabrication, such as, for example, in forming emitter tips for field emission display (FED) devices. An exemplary method of forming FED emitter tips in accordance with the present invention is described with reference to FIGS. 1–8.

Referring to FIG. 1, a fragment 10 of a semiconductive material construction is illustrated at a preliminary step of a method of the present invention. Fragment 10 comprises a glass plate 12, a first semiconductive material layer 14 overlying glass plate 12, a second semiconductive material 16 overlying material 14, and a silicon dioxide layer 18 overlying second semiconductive material 16. Semiconductive material 14 can comprise either a p-type doped or an n-type doped semiconductive material (such as, for example, monocrystalline silicon), and semiconductive material 16 can comprise doped polycrystalline silicon (polysilicon) material. Materials 12, 14 and 16 together comprise a conventional emitter tip starting material. Silicon dioxide layer 18 has an uppermost surface 19. It is noted that the above-described materials of layer 14, 16 and 18 are exemplary materials. Layer 18 can comprise any material which is selectively etchable relative to the material of layer 16. Depending on the construction of layer 16, layer 18 can comprise, for example, nickel, chrome, silicon nitride, and/ or the above discussed silicon dioxide. Layer 16 can comprise any material suitable for forming emitter tips, including, for example, silicon carbide, boron nitride, metal, and/or the above-discussed polysilicon.

To aid in interpretation of this disclosure and the claims that follow, it is noted that either of layers 14 and 16 can be referred to as a "semiconductive substrate". More specifically, the term "semiconductive substrate" is defined to mean any construction comprising semiconductive material, including, but not limited to, bulk semiconductive materials (either alone or in assemblies comprising other materials thereon), and semiconductive material layers (either alone or in assemblies comprising other materials). The term "substrate" refers to any supporting structure, including, but not limited to, the semiconductive substrates described above.

A layer 20 of organic molecules 22 (only some of which are labeled) is formed over silicon dioxide material 18. In the shown embodiment, organic layer 20 comprises a film of molecules arranged such that layer 20 is one molecule deep. Such layer 20 that is one molecule deep can be referred to as a monomolecular film. Each of molecules 22 comprises two ends (24 and 26), which are connected by a linking segment 28. Ends 26 are configured to adhere to masking particles (described below with reference to FIG. 4), while ends 24 are configured to adhere to layer 18. The masking particle binding group of end 26 is symbolized by a square in FIG. 1, and the group binding to layer 18 is symbolized by a circle. Ends 26 define an upper surface of layer 20 which has masking particle adhering properties.

Organic molecules 22 can be provided by exposing uppermost surface 19 of silicon dioxide layer 18 to silane. Such silane can comprise the formula $R_nSiX_m$, wherein R is an organic functional group, n is an integer of from 1 to 3, X is, for example, a halogen, alkoxy or amine, and m=(4−n). The silane reacts with surface 19 to bond molecules comprising $R_nSiX_m$ to surface 19. The individual R groups of the bound molecules 22 have two ends which can be referred to as a first end and a second end. The first end is bound to the Si of the RSi, and the second end is spaced from the Si by a length of an individual R group. The bound molecules are oriented with the first ends directed toward surface 19, and the second ends spaced further from the surface than the first ends. Masking particle bonding groups 26 are ultimately provided at the second ends. The masking particle bonding groups 26 can be provided either before or after reacting the silane with exposed surface 19. In a particular aspect of the invention, the masking particle bonding groups are nitrogen-containing groups, such as, for example, $NH_2$. In a preferred embodiment of the invention, the R groups of the silane are non-polar during reacting of the silane with exposed surface 19, and nitrogen-containing groups 26 are attached to the R groups after reacting the silane with the exposed surface. Conventional chemistry can be utilized for attaching the nitrogen-containing groups to the non-polar R groups. The class of non-polar R groups can include, for example, olefins, acetylenes, diacetylenes, acrylates, aromatic hydrocarbons, methacrylates, methyl, perfluorinated hydrocarbons, primary amines, long chain hydrocarbons and esters. It will be noted that in embodiments in which the non-polar R groups comprise primary amines, the non-polar R groups inherently can comprise nitrogen-containing end groups 26.

Referring to FIG. 2, construction 10 is exposed to a patterned beam of radiation 30. Radiation 30 can be patterned by passing the radiation through a mask containing opaque and transparent features. The patterned radiation 30 strikes some of molecules 22, and others of molecules 22 are not exposed to radiation 30.

Referring to FIG. 3, the molecules 22 exposed to radiation 30 are cleaved by the radiation to release masking particle adhering groups 26 from the molecules. The cleavage occurs along linking portion 28. Such cleavage can be generated by utilizing radiation having an energy that is of the same order of magnitude as that of covalent bonds in the linking portions 28, and is generally referred to as photolysis. Suitable radiation can comprise x-rays, electron beams, or ultraviolet light, depending on the nature of the covalent bonds. The removal of masking particle adhering groups 26 from the molecules 22 exposed to radiation 30 renders such exposed molecules less capable of adhering masking particles than are the molecules that were not exposed to radiation 30.

Referring to FIG. 4, masking particles 40 are adhered to masking particle bonding regions 26 of organic molecules 22. Masking particles 40 can comprise, for example, latex beads, or carboxyl latex beads, and can be approximately spherical, with diameters of from about 0.2 to about 2 micrometers. Masking particles 40 comprise exposed moieties 42 which are attracted to and/or reactive with masking particle adhering groups 26. In an exemplary application, masking particle adhering groups 26 can comprise nitrogen and exposed moieties 42 of the masking particles can comprise carboxylate groups. The nitrogen of adhering groups 26 can be reacted with the carboxylate groups of moieties 42 utilizing conventional chemistry to form covalent bonds. In an alternative application, masking particle adhering groups 26 can comprise carboxylate groups and exposed moieties 42 can comprise nitrogen.

A method of adhering particles 40 to particle adhering groups 26 is to expose layer 20 to a colloidal suspension of masking particles 40 under conditions in which moieties 42 react with adhering groups 26. Excess masking particles can then be removed by, for example, ultrasonic vibration, mechanical scraping (e.g., squeegeeing) and/or rinsing of a surface of layer 20. After removal of excess masking particles, the remaining masking particles adhered to groups 26 form a patterned mask over layer 18. It is noted that in the shown embodiment particles 40 are sized such that approximately three organic molecules 22 bind per particle 40. The number of organic molecules binding per particle can be varied by, for example, altering the size of the particles, the spacing of reactive moieties 42 across a surface of the particles, and/or the size of reactive groups 26.

Referring to FIG. 5, masking particles 40 are utilized as a masking layer during removal of portions of silicon dioxide layer 18. The silicon dioxide is preferably removed with an etch selective for silicon dioxide relative to the silicon material of layer 16. If layer 16 comprises polysilicon, a suitable etch is an oxide etch utilizing at least one of $CF_4$ or $CHF_3$. The etching of material 18 transfers a pattern from masking particles 40 to material 18, and thereby forms masking blocks 50 from material 18. In the shown embodiment, particles 40 are the sole masking material provided over layer 18 during the etching and have uppermost surfaces that are exposed during the etching. In other embodiments (not shown), additional materials can be provided over surfaces of particles 40 prior to the etching. Such other materials can protect surfaces of particles 40 from the etch conditions and/or can further define a mask provided by particles 40.

Referring to FIG. 6, masking particles 40 (FIG. 5) and organic molecules 22 (FIG. 5) are removed from over masking blocks 50. Suitable methods for removing masking particles 40 and organic materials 22 are exposure to conditions which cleave organic materials 22. Preferably, such conditions are selective for cleavage of organic materials 22 and do not etch the polysilicon of layer 16. Exemplary chemistry which can be utilized for cleaving the R groups of organic materials 22 selectively relative to etching of polysilicon 16 include utilization of n-methylpyrrolidine. In the shown embodiment, organic materials 22 are completely removed from over masking blocks 50. However, it is to be understood that the invention encompasses other embodiments (not shown) wherein a portion of organic materials 22 remains over masking blocks 50 after removal of masking particles 40. For instance, the invention encompasses embodiments wherein the linking R groups 28 (FIG. 5) are cleaved to remove masking particles 40. Such cleavage will leave bonding portions 24 remaining adhered to masking blocks 50.

Referring to FIG. 7, construction 10 is exposed to etching conditions which selectively etch polysilicon material 16 while utilizing blocks 50 as masks, to form emitter structures 54. Emitter structures can, for example, be conically-shaped. In embodiments in which blocks 50 comprise silicon dioxide and material 16 comprises polysilicon, the etching can comprise, for example, a silicon dry etch utilizing $SF_6$ and helium.

Referring to FIG. 8, masking blocks 50 are removed to form an emitter tip array comprising emitter structures 54. In embodiments in which masking blocks 50 comprise silicon dioxide, they can be removed by, for example, wet etching utilizing buffered hydrofluoric acid. The emitter tip array of FIG. 8 can be incorporated into, for example, a flat panel display device as an emitter assembly, as illustrated in FIG. 9. Specifically, FIG. 9 illustrates a field emission display 70 which includes emitters 54. Field emission display 70 further includes dielectric regions 72, spacers 73, an extractor 74, and a luminescent screen 76. Techniques for forming field emission displays are described in U.S. Pat. Nos. 5,151,061; 5,186,670 and 5,210,472; hereby expressly incorporated by reference herein. Emitters 54 emit electrons 78 which charge screen 76 and cause images to be seen by a user on an opposite of screen 76.

A second embodiment processing method encompassed by the present invention is described with reference to FIGS. 10–13. In referring to the second embodiment, similar number to that utilized above in describing the first embodiment will be used, with differences indicated by the suffix "a", or by different numerals. Referring to FIG. 10, a fragment **10*a* of a semiconductive material construction is illustrated at a preliminary step of the second embodiment method of the present invention. Fragment 10*a* comprises a glass plate 12, a first semiconductive material layer 14 overlying glass plate 12, a second semiconductive material 16 overlying material 14, and a silicon dioxide layer 18 overlying second semiconductive material 16**.

A layer **20*a* of organic molecules 22*a* (only some of which are labeled) is formed over silicon dioxide material 18. Molecules 22*a* are identical to the molecules 22 described above with reference to FIG. 1, with the exception that molecules 22*a* comprise a blocking group 80 (symbolized by an asterisk) attached to ends 26 by a linking segment 82. As will become evident in the discussion that follows, blocking groups 80 can impede interaction of particle adhering groups 26 with particles. Depending on the nature of the particles, blocking groups 80 can comprise, for example, cationic groups, anionic groups or non-polar groups. For instance, if the particles comprise exposed carboxylate groups (anionic groups), blocking groups 80** can also comprise anionic groups (such as, for example, carboxylate groups) to repel the particles.

Referring to FIG. 11, construction **10*a* is exposed to a patterned beam of radiation 30. Radiation 30 can be patterned by passing the radiation through a mask containing opaque and transparent features, as discussed above with reference to FIG. 2. The patterned radiation 30 strikes some of molecules 22*a*, and others of molecules 22*a* are not exposed to radiation 30**.

Referring to FIG. 12, the molecules **22*a* exposed to radiation 30** are cleaved by the radiation to release blocking groups 80 from the molecules. The cleavage occurs along linking portion 82. Such cleavage can be generated by utilizing radiation- having an energy that is of the same order of magnitude as that of covalent bonds in the linking portions 82. Suitable radiation can comprise x-rays, electron beams, or ultraviolet light, depending on the nature of the covalent bonds. The removal of blocking groups 80 from the molecules 22a exposed to radiation 30 renders such exposed molecules more capable of adhering masking particles than are the molecules that were not exposed to radiation 30. Specifically, the removal of blocking groups 80 from the molecules 22a exposed to the radiation unblocks the masking particle adhering groups 26 of such molecules.

Figure 9:
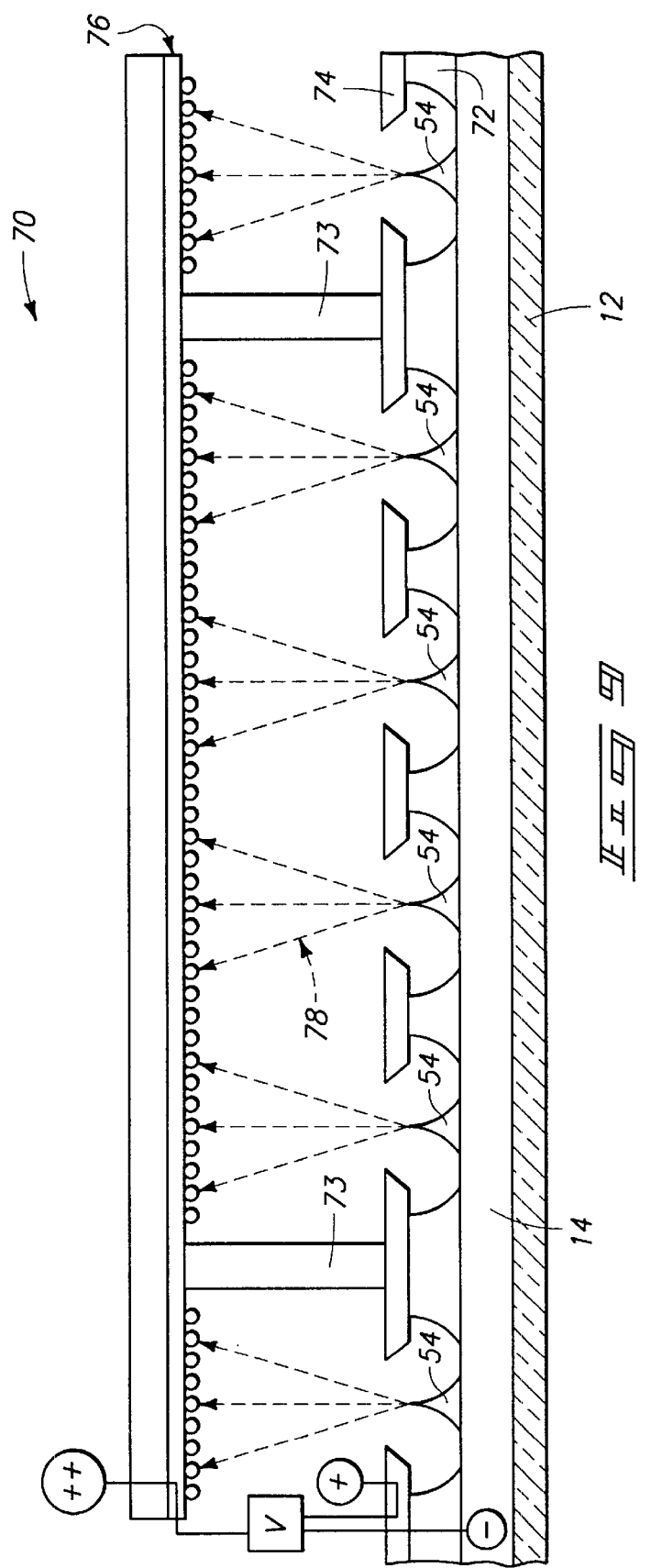
FIG. 9 is a schematic, cross-sectional view of one embodiment of a field emission display incorporating emitters shown in FIG. 8.

Referring to FIG. 13, masking particles 40 are adhered to the unblocked masking particle bonding groups 26 of organic molecules 22a. As discussed above with reference to FIG. 4, masking particles 40 comprise exposed moieties 42 which can be reactive with masking particle adhering groups 26. After adhering masking particles 40 to groups 26, subsequent processing analogous to that described above with reference to FIGS. 5–9 can be utilized to form emitters from construction 10a and incorporate such emitters into an FED device.

It is noted that the methods described with reference to FIGS. 1–13 are merely exemplary methods of the present invention, and that the invention encompasses other embodiments besides those specifically shown. For instance, in the shown exemplary method masking particles 40 (FIGS. 4, 5 and 13) are provided over a silicon dioxide material 18, which is in turn provided over a polycrystalline material 16. The invention encompasses other embodiments (not shown) wherein silicon dioxide layer 18 is eliminated, and organic molecules (22 or 22a) are adhered directly to polycrystalline silicon material 16. Also, although the shown embodiment illustrates masking particles 40 being removed before an etch of polycrystalline silicon material 16, the invention encompasses other embodiments wherein masking particles 40 are not removed until after the etch of polycrystalline silicon 16. Further, although the described invention cleaves some of the organic molecules of layers prior to provision of masking particles 40, the invention encompasses other embodiments wherein layer 20 is not exposed to patterned radiation prior to adhering masking particles 40 to the layer. In such embodiments, the masking particles can form a uniform monolayer across a surface of a substrate. An alternative method of forming a uniform monolayer of masking particles across a surface of a substrate is to expose an entirety of a layer 20a (FIG. 10) to radiation, rather than exposing only portions of the layer 20a to radiation. Exposure of the entirety of the layer 20a will unblock particle adhering groups 26 across an entirety of the layer to enable bonding of masking particles across the entirety of the layer.

Although the invention is described above with reference to methods of forming emitter structures for field emission display devices, it is to be understood that such is merely an exemplary application of the present invention. The invention can be utilized for patterning constructions other than emitter tips. In such applications, organic molecules analogous to molecules 22 or 22a can be adhered over or on monocrystalline silicon substrates, polycrystalline silicon substrates, or other substrates that are ultimately to be patterned into particular shapes. The present invention, like standard lithography techniques, enables persons of ordinary skill in the art to control size (i.e., critical dimension) of features and placement of features. The present invention is improved over standard lithography techniques in that it can be utilized to obtain very small feature sizes (sizes on the order of 0.05 μm) more economically than can be obtained by standard lithography processes. The present invention can also offer improvements over the particle dispersment technologies (such as the process of U.S. Pat. No. 5,676,853 to Alwan) in that the present invention can enable stringent control of emitter tip placement. Any technology that can benefit from economical control of small features sizes, and stringent control of feature location, can benefit from application of methods of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An etch-resistant mask comprising:
   a plurality of individual molecules disposed over a substrate, each molecule comprising a first end and a second end, the first end being directed toward the substrate and the second end being directed away from the substrate;
   a plurality of particle-adhering groups bound to the second ends of at least some of the molecules, the particle-adhering groups containing components; and
   a plurality of particles, each particle adhered to at least some of the particle-adhering groups bound to second ends of the molecules, the particles containing moieties reactive with the components of the particle-adhering groups; the components comprising either nitrogen or carboxyl groups, and the moieties comprising the other of nitrogen and carboxyl groups.

2. The etch resistant mask of claim 1, wherein the plurality of individual molecules disposed over the substrate form a monomolecular film.

3. The etch resistant mask of claim 1, wherein the plurality of particles include approximately spherical beads comprising latex.

4. The etch resistant mask of claim 1, wherein the plurality of particles include approximately spherical beads comprising carboxyl latex.

5. The etch resistant mask of claim 1, wherein the substrate comprises silicon.

6. The etch resistant mask of claim 1, wherein the substrate comprises silicon dioxide.

7. The etch resistant mask of claim 1, wherein the components comprise the nitrogen and the moieties comprise the carboxyl groups.

8. The etch resistant mask of claim 1, wherein the components comprise the carboxyl groups and the moieties comprise the nitrogen.

* * * * *